United States Patent
Gupta et al.

(10) Patent No.: US 9,502,330 B1
(45) Date of Patent: Nov. 22, 2016

(54) COOLANT DISTRIBUTION STRUCTURE FOR MONOLITHIC MICROWAVE INTEGRATED CIRCUITS (MMICS)

(71) Applicant: Raytheon Company, Waltham, MA (US)

(72) Inventors: Anurag Gupta, Canton, MA (US); David H. Altman, Framingham, MA (US); Jason G. Milne, Hawthorne, CA (US); Christopher R. Koontz, Manhattan Beach, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 14/734,372

(22) Filed: Jun. 9, 2015

(51) Int. Cl.
*H01L 23/473* (2006.01)
*H01L 23/66* (2006.01)
*H01L 23/373* (2006.01)
*H01L 23/367* (2006.01)

(52) U.S. Cl.
CPC ........... *H01L 23/473* (2013.01); *H01L 23/367* (2013.01); *H01L 23/3732* (2013.01); *H01L 23/66* (2013.01); *H01L 2223/6683* (2013.01)

(58) Field of Classification Search
CPC ... H01L 23/473; H01L 23/367; H01L 23/66; H01L 23/3732; H01L 2223/6683
USPC ......................................................... 257/714
See application file for complete search history.

(56) References Cited

U.S. PATENT DOCUMENTS

| | | | |
|---|---|---|---|
| 7,548,424 B2 * | 6/2009 | Altman | H01L 23/473 165/80.3 |
| 8,987,892 B2 | 3/2015 | Davis et al. | |
| 2014/0196871 A1 * | 7/2014 | Otsuka | H05K 7/20236 165/104.33 |

OTHER PUBLICATIONS

C.T. Creamer, K.K. Chu, P.C. Chao, B. Schmanski, T. Yurovchak, S.Sweetland, Geoff Campbell, Henry Eppich, Micro Cooled, High Power GaN-Diamond MMIC, IEEE, 5 pages.

* cited by examiner

*Primary Examiner* — Fernando L Toledo
*Assistant Examiner* — Adam S Bowen
(74) *Attorney, Agent, or Firm* — Daly, Crowley, Mofford & Durkee, LLP

(57) ABSTRACT

A coolant distribution structure for an MMIC having: an input/output layer with an input port for receiving a coolant for transmission to coolant channels in the MMIC and an output port for exiting the coolant after such coolant has cooled active devices in the MMIC, a coolant pass-through layer to receive the coolant from the input port and having structure to inhibit such received coolant from passing directly to the output port, a coolant distribution layer for receiving coolant passing from the coolant pass-through layer and distributing such received coolant to the cooling channels to absorb heat generated by the active devices and then directing heated coolant to the coolant distribution layer and out of the porting layer via the pass-through layer. The coolant pass-through layer has a structure configured to inhibit such heated coolant from passing directly to the input port prior to such heated absorbed coolant being transmitted to the output port.

18 Claims, 12 Drawing Sheets

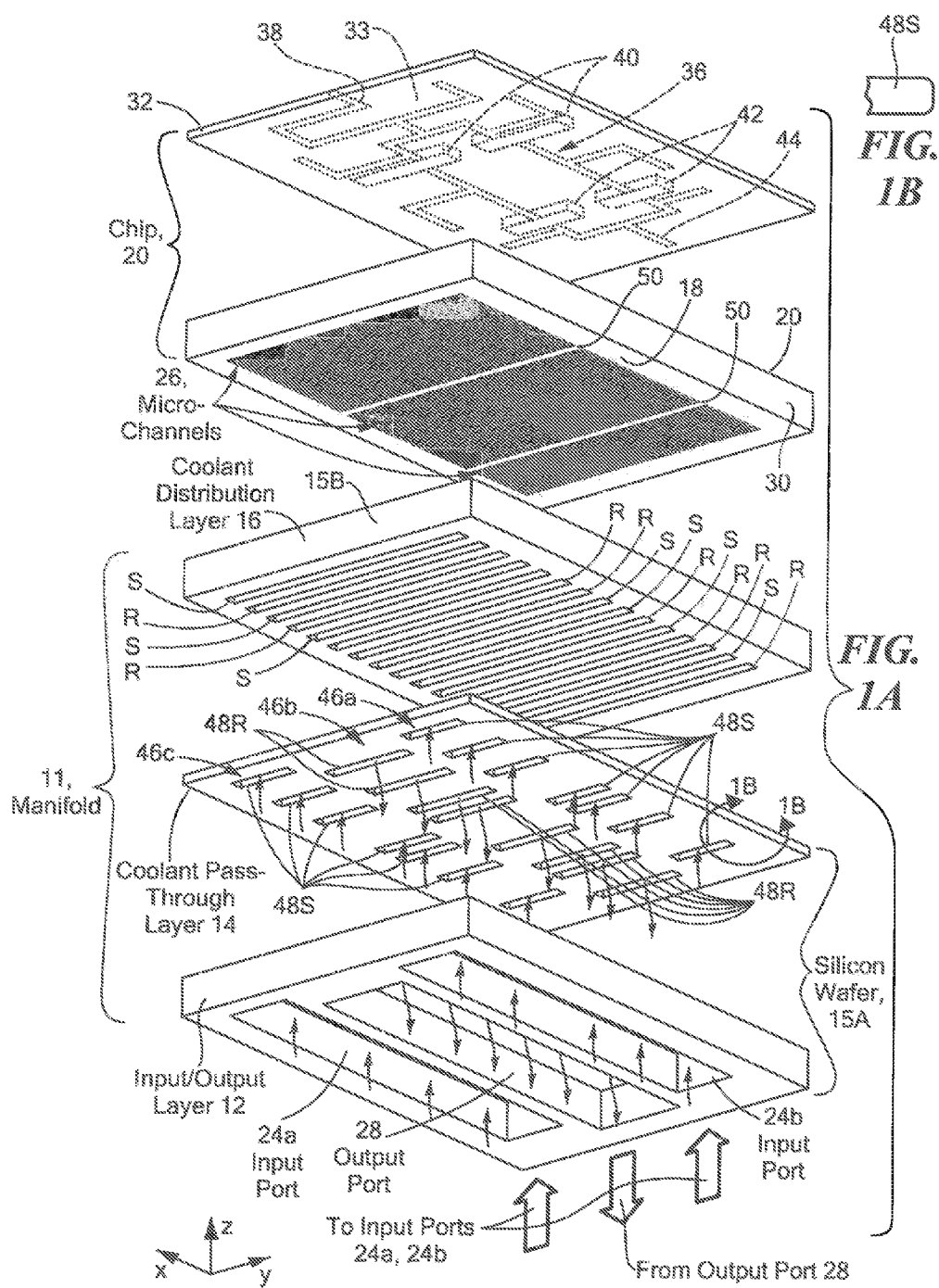

COOLANT DISTRIBUTION STRUCTURE FOR MONOLITHIC MICROWAVE INTEGRATED CIRCUITS (MMICS)

GOVERNMENT RIGHTS

This invention was made with government support under Contract No. FA8650-14-C-7469 awarded by the Department of the Air Force. The government has certain rights in this invention.

TECHNICAL FIELD

This disclosure relates generally to semiconductor cooling structures and more particularly to coolant distribution structures for enabling coolant to flow in very close proximity to active semiconductor devices, such as Field Effect Transistors (FETs), of monolithic microwave integrated circuits (MMICs).

BACKGROUND

As is known in the art, coolant structures are used to provide coolant in MMICs. One such structure is described in U.S. Pat. No. 7,548,424, inventors Altman, et al. issued Jun. 16, 2009 entitled, "Distributed transmit/receive integrated microwave module chip level cooling system" assigned to the same assignee as the present patent application. while such coolant structure provides coolant for MMIC Chips in many applications, as power handling requirements increase there are applications requiring even higher coolant capacity and efficiencies. More particularly, in many MMIC chips having very high density active semiconductor devices it is highly desirable to provide liquid coolant flow in close proximity to the active devices. This introduces challenges from a hardware design and fabrication standpoint and introduces complexity from an electrical standpoint which a cooling structure must overcome.

SUMMARY

In accordance with the present disclosure, a coolant distribution structure for an MMIC is provided having: an input/output port having at least one input port for receiving a coolant for transmission to coolant channels in the MMIC and at least one output port for exiting the coolant after such coolant has cooled active devices in the MMIC; a coolant pass-through layer to receive the coolant from the at least one input port and having structure to enable flow through the coolant channels by inhibiting such received coolant from passing directly to the output port; a distribution layer for receiving coolant passing from the coolant pass-through layer and distributing such received coolant to the cooling channels to absorb heat generated by the active devices and then directing the heated coolant back to the at least one output port of the input/output port layer.

In one embodiment, a coolant distribution structure is provided for a monolithic integrated circuit (MMIC), the MMIC having a substrate with an active device layer on the top surface of the substrate and a plurality of coolant channels formed on a bottom surface of the substrate. The coolant distribution structure includes: an input/output port layer having at least one input port for receiving a coolant for transmission to the plurality of coolant channels and an output port for exiting the coolant after such coolant has cooled active devices in the active device layer; a coolant pass-through layer disposed on the input/output port layer to receive the coolant from the input port and having a input transmission structure portion configured to inhibit such received coolant from passing directly to the output port of the input/output port layer prior to such received coolant being transmitted to the plurality of cooling channels; and a coolant distribution layer mounted to the bottom surface of the substrate for receiving coolant passing from pass-through layer, the coolant distribution layer distributing such received coolant to the plurality of cooling channels to absorb heat generated by the active devices, and then re-directing heated coolant back to the output port of the input/output layer via the pass-through layer. The pass-through layer and the coolant distribution layer are configured to have a coolant transmission structure that allows intake of cold coolant from the input/output port layer in only the input port and exhaust of heated coolant back to the output port layer to prevent short circuiting (that is, a direct flow) of cold and heated coolant streams.

In one embodiment, the input/output port layer has a pair of spaced input ports and wherein the output port is disposed between the pair of input ports.

In one embodiment, the coolant pass-through layer has formed therein: two sets of a plurality of parallel slots, each one of the sets being disposed over a corresponding one of the pair of input ports, the slots in the two sets being aligned one with the other to provide the input transmission structure portion; and a third set of parallel slots disposed over the output port, the slots in the third set being offset laterally from the slots in said two sets to provide the output transmission structure portion.

In one embodiment, the slots in said two sets of parallel slots are disposed in a pair of rows and the slots in the second set of slots are disposed in a row parallel to said pair of rows.

In one embodiment, the slots in the said third set of parallel slots disposed over the output port are disposed in a row parallel to the pair of rows of slots disposed over the input ports.

In the embodiment, the slots in the said third row of slots are offset laterally from and disposed centrally between the rows of slots disposed over the input ports.

In one embodiment, the slots in said two sets and in the third set are elongated along a direction perpendicular to the rows.

In one embodiment, the input and the output ports in the input/output port layer are elongated a width of the MMIC and span the rows of slots in the distribution layer and the pass through layer.

In one embodiment, the coolant distribution layer has formed therein a plurality of parallel slots, one set of the parallel slots being supply slots and another set of the parallel slots being return slots, the set of supply slots being in aligned with the slots in the pair of a first plurality of parallel slots in the pass-through layer and the set of return slots being in aligned with the slots in the second set of slots in the pass-through layer.

In one embodiment, the slots in the coolant distribution layer are parallel to the slots in the coolant pass-through layer.

In one embodiment, the slots in the distribution layer and the pass-through layer are configured transverse to the input and the output ports of the input/output port layer such that the direction of coolant flow in the slots in the distribution layer is perpendicular to the long dimension of the input port and the output port of the input/output port layer.

In one embodiment, the coolant channels in the MMIC are blind-etched into the MMIC from the back-side to form an integrated heat sink with the un-etched portion of the MMIC.

In one embodiment, the coolant channels have a width span of a few tens of microns and a depth of more than 250 µm in high conductivity diamond to be characterized as high aspect ratio diamond micro-channels.

In one embodiment, the coolant channels in the substrate are elongated along a direction perpendicular to the slots in the distribution layer.

In one embodiment, sections of the coolant channels are separated one from another by partitions to provide the channels with discontinuities along the lengths of the channels.

In one embodiment the partitions are disposed under the active devices.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 1A is an exploded view, of an input/output layer, a coolant pass-through layer, a coolant distribution layer, and an MMIC chip of FIG. 1, having a substrate with an active layer on the upper surface of the substrate thereof and having formed in the back side thereof micro-channels according to the disclosure;

FIG. 1B is an enlarged, plan view of a portion of an end of one slot in one of the layers of the coolant distribution structure of FIG. 1, such enlarged portion being partially circled by an arrow in FIG. 1A;

Like reference symbols in the various drawings indicate like elements.

DETAILED DESCRIPTION

Figure 1:
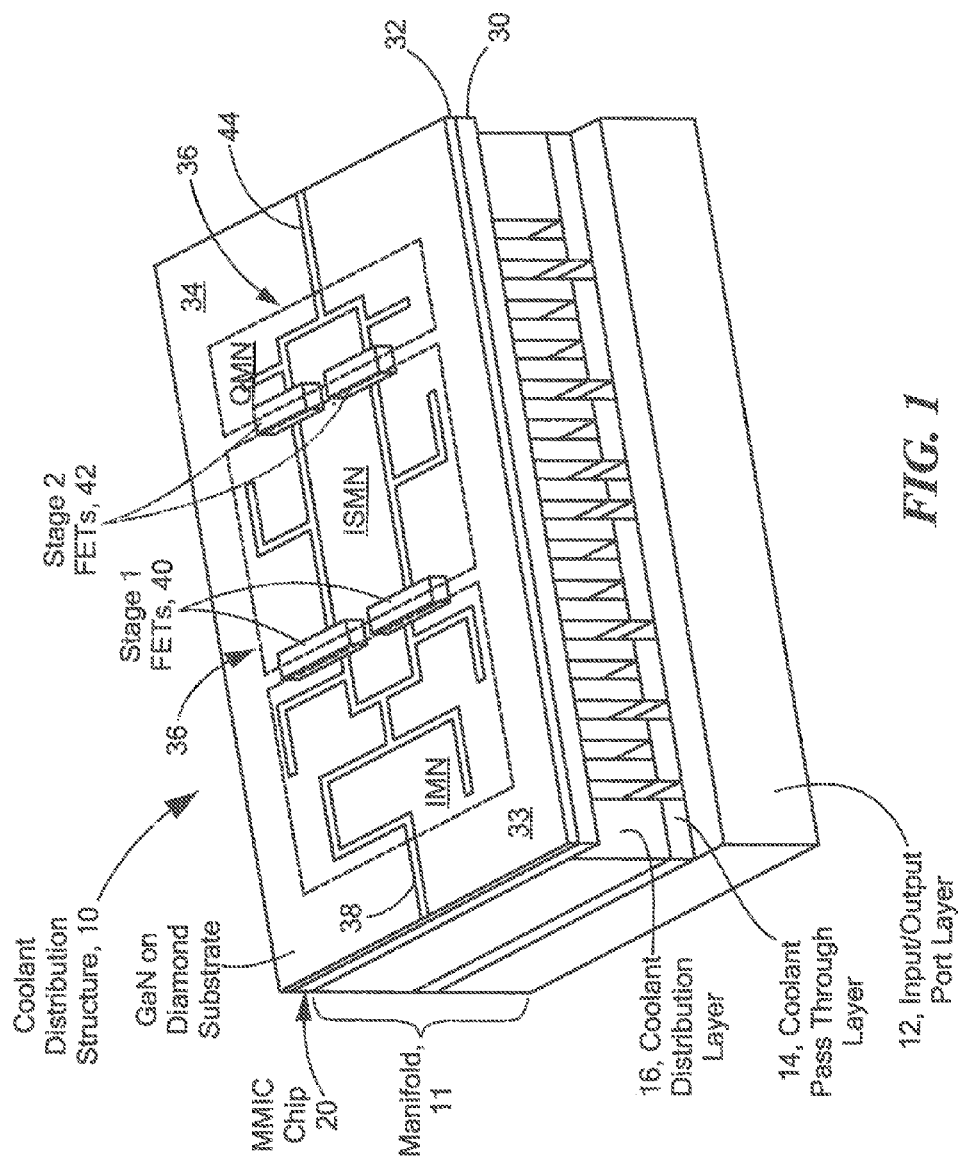
FIG. 1 is an isometric view of an monolithic integrated circuit (MMIC) chip having active devices therein cooled by a coolant distribution structure, partially cut away, and mounted to a back-side the MMIC according to the disclosure.

Referring now to FIGS. 1 and 1A, a coolant distribution structure 10 is shown having: a manifold 11 for mounting to the back side of a MMIC, here a MMIC chip 20. Here the manifold 11 is a silicon manifold having: a bottom, silicon input/output port layer 12 (FIG. 1A), a middle, silicon coolant pass-through layer 14, and a upper silicon coolant distribution layer 16, here, for example, fabricated from two $SiO_2$ bonded silicon (Si) wafers 15A 15B. It is noted that that while the input/output port layer 12 and the coolant pass-through layer 14 may be formed from two separate silicon wafers, here, in this embodiment, the input/output port layer 12 and the coolant pass-through layer 14 are formed using the same wafer 15A; it being noted that for purposes of illustration, the input/output port layer 12 and the coolant pass-through layer 14, although here formed from a single wafer 15A, are shown exploded in FIG. 1A. More particularly, the wafer 15A is processed first from one side using photolithographic-etching techniques to form, in about one half the thickness of the wafer, the input/output layer 12 and is next processed from the other side to form in the remaining thickness of the wafer 15A, the coolant pass-through layer 14. The wafer 15B is processed from only one side using photolithographic-etching techniques to form the coolant distribution layer 16. After processing the two wafers 15A and 15B as described, the two wafers 15A and 15B are coated with silicon oxide, polished and then bonded together using plasma activated oxide bonding. It should be noted that the cross sectional views of FIGS. 2A-2D and 3A indicate, for illustration, the input/output port layer 12 and the coolant pass-through layer 14 as two separate silicon members.

The MMIC chip 20 includes a diamond substrate 30 having formed on an upper surface thereof, here for example by MOCVD, an active device layer 32, here for example, GaN. More particularly, the substrate 30 of a monolithic integrated circuit (MMIC) chip 20 (FIG. 1A) is fabricated from high conductivity Chemically Vapor Deposited (CVD) diamond gown to a thickness of here, for example, 300 µm, having the back side 18 thereof polished to <1 µm Ra. The CVD grown diamond substrate 30 is dry-etched, using for example, a Reactive Ion Etch (RIE) to form a plurality of blind, coolant micro-channels 26, here for example, with an aspect ratio of approximately 10:1.

More particularly, the MMIC chip 20 coolant micro-channels 26 (FIG. 2A), here etched out of a solid diamond blank, with blind micro-channel terminations on the substrate 30; thus, the micro-channels 26 and substrate 30 are integrated with one another being part of the same diamond blank.

The active device layer 32 (FIG. 1), here for example, a 0.5 to 2 µm thick layer of Gallium Nitride (GaN), here, for example, using a metalorganic chemical vapor deposition (MOCVD) process. A hermetic seal, not shown, is formed between the MMIC chip 20 and the Si manifold 11 comprising of layers 12, 14 and 16 (FIG. 1A) on the backside surface 18 (FIG. 1A) of the chip 20 using for example, a bonding technique described in U.S. Pat. No. 8,987,892, issued Mar. 24, 2015, entitled "Method for creating a selective solder seal interface for an integrated circuit cooling system", inventors Davis et al., assigned to the same assignee as the present patent application. As noted above, the backside surface 18 is polished to <1 µm Ra prior to bonding. The micro-channels 26 have an aspect ratio of greater than 10:1. Here, for example, the micro-channels 26 have a width of 25 µm, are separated one from another 25 µm, have a depth >250 µm with the diamond substrate 30 having a thickness of 300 µm Still more particularly, the upper surface 33 (FIGS. 1 and 1A)-the active device layer 32 of the MMIC chip 20 has firmed thereon, a microwave, two-stage amplifier circuit 36. The circuit 36 is fed RF signals received on an input co-planar waveguide (CPW) transmission line 38; it being noted that while CPW has a strip conductor disposed between a pair of coplanar ground plane conductors (not shown), here, for convenience in illustration, only the strip conductor portion of the CPW is shown. The received RF signals are fed to the first amplification stage 40, here a pair of Field Effect Transistors FETs 40, through a passive input matching network (IMN), here also, for example, CPW transmission line network (here again only the strip conductor portion of the CPW being shown). The first stage amplified signals are then fed to a second amplification stage 42, here also a pair of FETs 42, through a passive interstage matching network (ISMN), here also, for example, CPW transmission network. The second stage amplified signals are then passed to output CPW transmission line 44 through a passive matching network (OMN), here also, for example, CPW transmission network.

Figure 2:
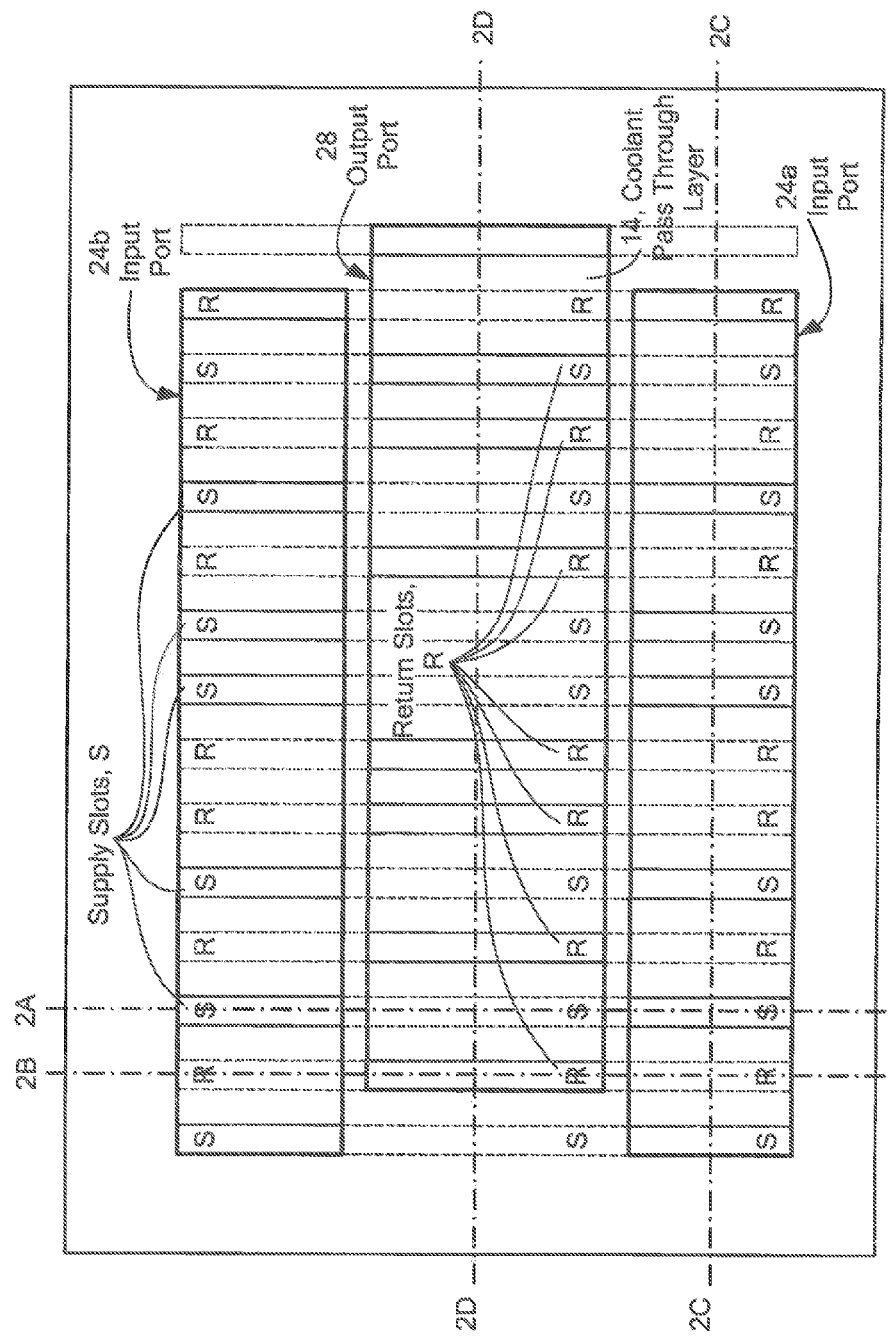
FIG. 2 is a plan view of the coolant distribution structure of FIG. 1 viewed from the bottom of an input/output port layer and exposed portions of a coolant distribution layer of the structure according to the disclosure.
Figure 2A:
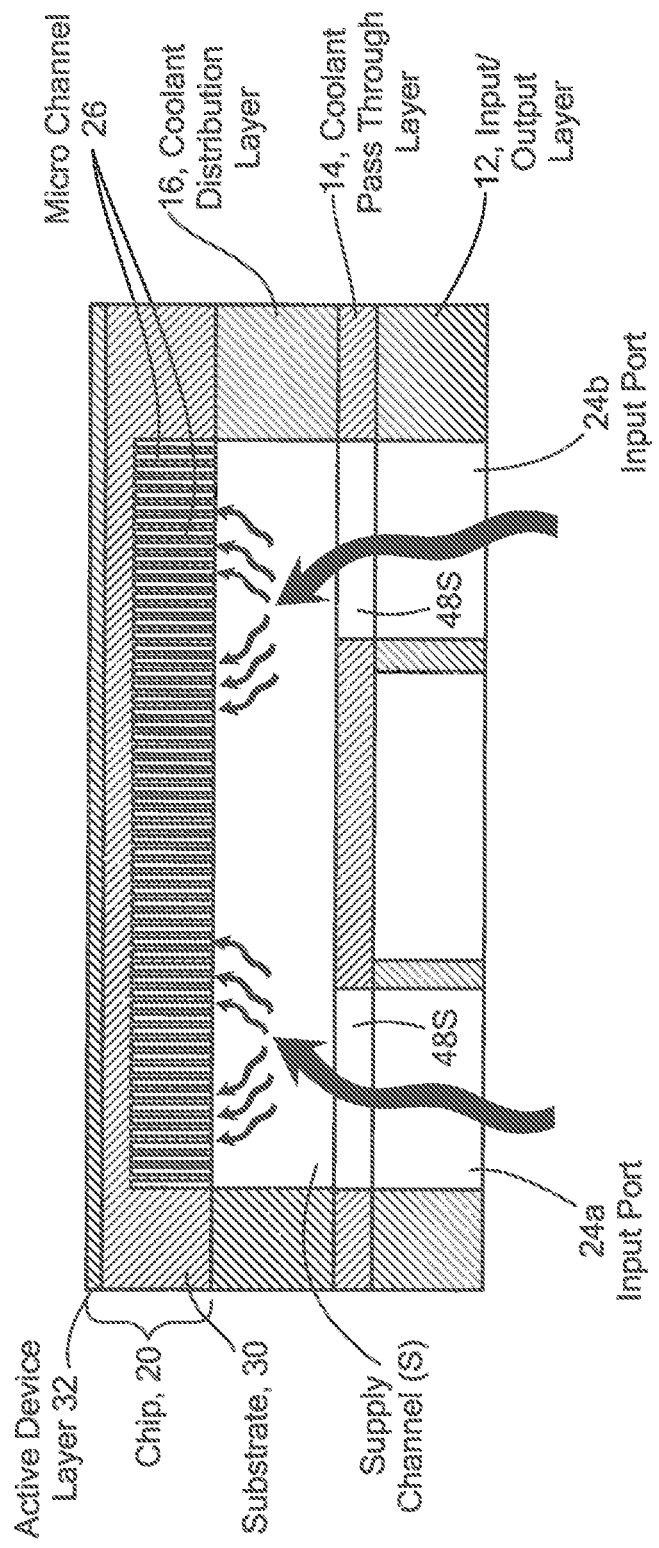
FIGS. 2A-2D are cross-sectional views of the coolant distribution structure of FIG. 1 taken along lines 2A-2A-2D-2D, respectively in FIG. 2 according to the disclosure, including a coolant distribution layer and an MMIC chip formed thereon according to the disclosure.
Figure 2B:
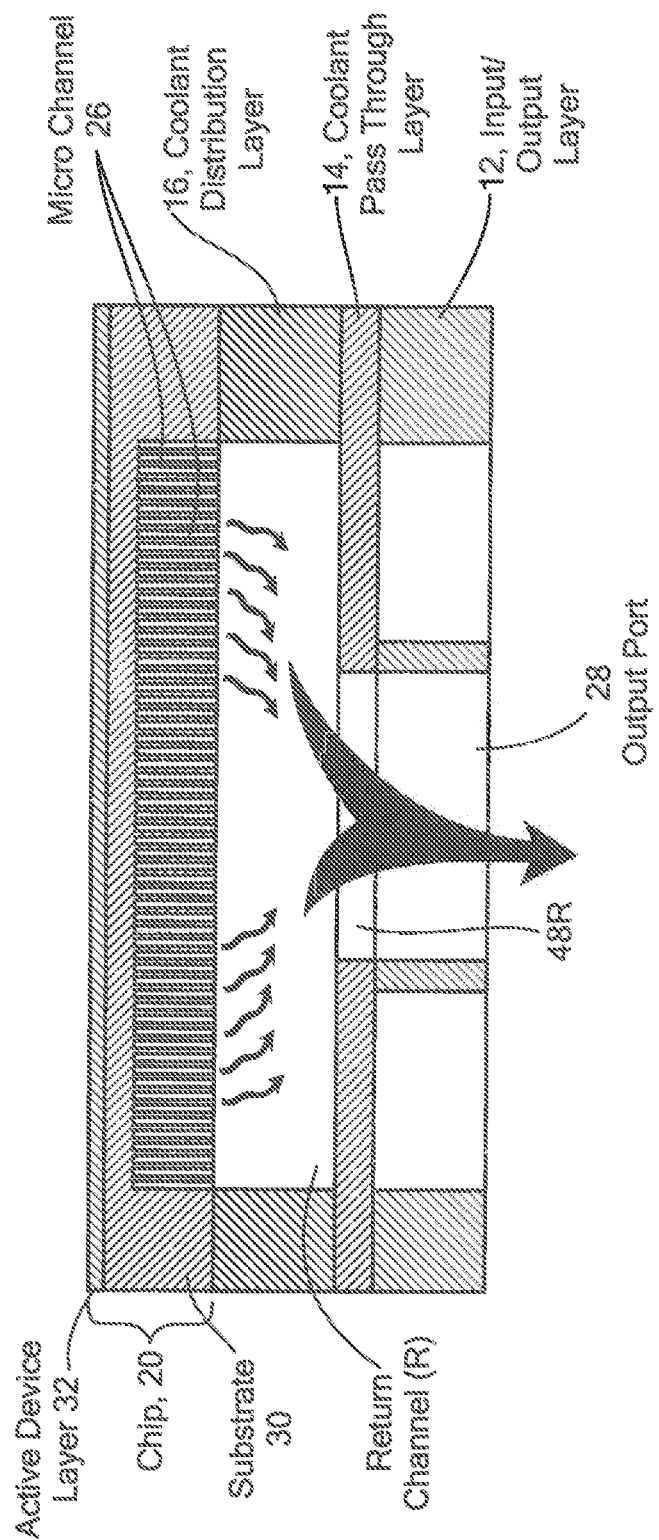
Figure 2C:
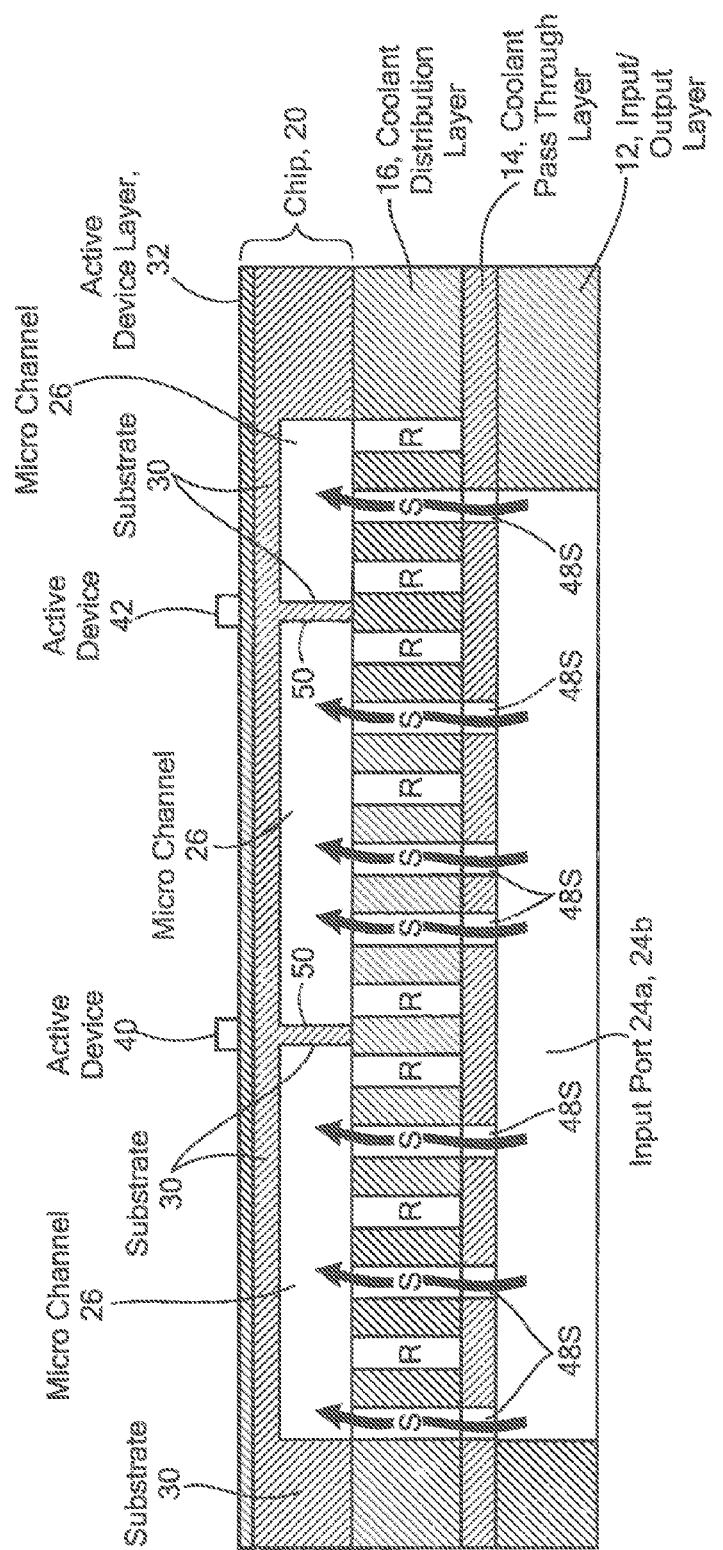
Figure 2D:
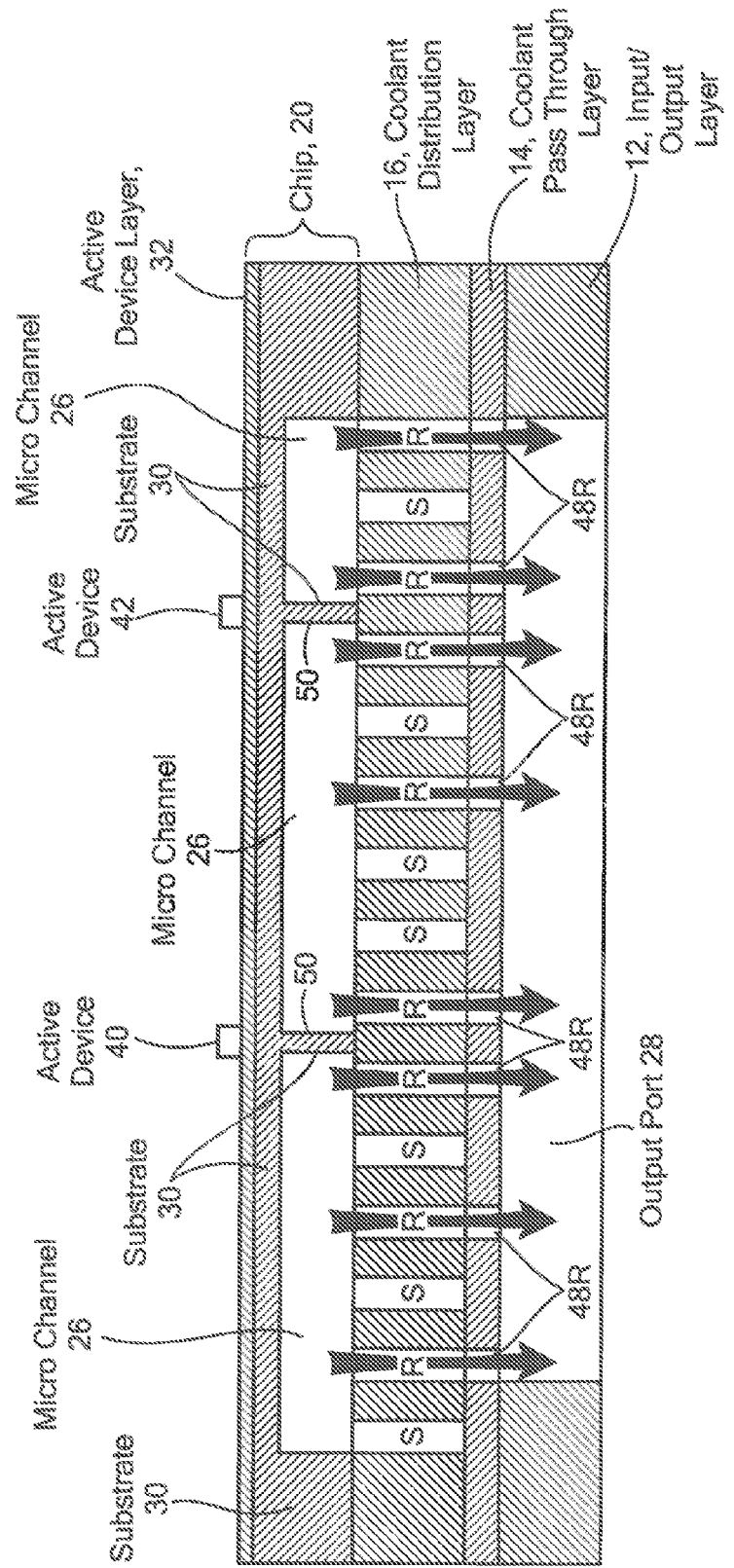

The manifold 11 of the coolant distribution structure 10 receives coolant from a cooling fluid amply, not shown, through, here for example, a pair of input ports 24a, 24b of the input/output port layer 12 (FIG. 1A) and directs the received coolant to channels 26, herein referred to as micro-channels 26 (FIGS. 2A and 2B) formed in the back-side of the MMIC chip 20 after such coolant passes through coolant pass-through layer 14 and coolant distribution layer 16 (FIGS. 2, 2A and 2B); the coolant then absorbs heat generated by active devices, here Field Effect Transistors (FETs), here, for example, HEMTs, formed in the top surface of MMIC chip 20 (FIG. 1) and is then directed by the coolant distribution structure 10 back to an exhaust, not shown, through an output port 28 of the input/output port layer 12 through the coolant distribution layer 16, coolant pass-through layer 14, as shown in FIGS. 2A, 2B, 2C and 2D.

Thus, coolant manifold 11 feeds coolant to the coolant channels 26 in the chip 20 to provide coolant flow in close proximity to the active the FETS 40, 42. The coolant channels 26, as noted above, have a blind end on the substrate 30 which enables electrical isolation between the active transistors FETs 40, 42 and the fluid by way of the un-etched portion of substrate 30 thickness. Thus, the coolant channels 26 that are part of the chip 20 form an integrated heat sink with the chip 20. The cooling channels 26 are micro-channels with very small effective fluid flow diameter to enable very high heat transfer rates to the fluid. These micro-channels 26 are configured in a parallel arrangement which ensures smaller heat gain by the fluid per flow path, thereby keeping the fluid and the chip 20 cool. Parallelization of channels 26 also enables distribution of flow over larger area of flow and shorter flow paths, which helps reduce the constriction to flow, thereby reducing pressure drop and energy requirements to drive the flow in the desired manner. The micro-channels 26 in the chip 20 do not extend continuously along the entire dimension of the chip 20 in the direction of the flow. Instead, the micro-channels 26 are separated along its length by partitions 50 formed in the hack side of the substrate 30, FIG. 1A. That is, the channels 26 are partitioned (broken) in regions in the vicinity of FETS 40, 42 such that there is no cooling fluid directly underneath the FETs 40, 42. This partitioned structure enables the heat to first "impinge" on the substrate 30, here diamond, partitions which spreads the heat, thereby reducing the heat density that the cooling fluid is required to alleviate. This strategy reduces the operating temperature of the active devices by means providing cooler fluid zones local to the heated device. The blind ending of the micro-channels 26 in the chip 20 is such that the cooling fluid is separated from the electrically active devices (the FETs 40, 42) by means of a diamond substrate 30. The substrate thickness, or the separation, between the fluid and active devices, is 50 µm for a 2-6 GHz MMIC in one embodiment. The Si manifold 11 and the diamond chip 20 are adhered together to form one complete fluid routing and cooling structure by means of a thin hermetic bonding interface, for example, a 6 µm layer of metallic solder that is is selectively deposited on the adhering surfaces of the diamond chip 20 and the Si manifold 11. The manifold 11 layers; the input/output layer 12, the pass-through layer 14 and the coolant distribution layer 16 are adhered to each other with $SiO_2$, thereby forming a multi-layered Si manifold structure 11. The fluid routing and diamond cooling structure 10 configured this way is tailored to the RF device geometry to enable precise, uniform and targeted distribution of coolant on the heated chip substrate surface.

With such structure, cooling channels are micro-channels configured in a massively parallel manifold arrangement to minimize pressure drop and maximize convective heat transfer performance. The micro-channels 26 are of similar width to enable creation using dry etching techniques. Partitions 50 (FIG. 1A) between micro-channels 26 are strategically located in proximity to the HEMT 20 being cooled to maximize conjugate (convection/conduction) heat transfer performance.

The micro-channels 26 are separated from the active GaN surface by a minimum distance to ensure minimal interaction between electrical fields and the coolant (e.g., 50 µm for a 2-6 GHz MMIC). Bonding layers form a thin hermetic interface between the diamond micro-channels 26 and a Si manifold 11 fluid distribution structure. The bonding layers are selectively deposited solder. The Si manifold 11 design that is tailored to the RF device geometry to enable precise, uniform and targeted distribution of coolant to the diamond micro-channels, while keeping the coolant supply pressure drop and power.

Referring now again, to FIGS. 2, 2A and 2B, the coolant distribution structure 10 includes: the input/output port layer 12 having the pair of input ports 24a, 24b for receiving the coolant for transmission to the plurality of micro-coolant channels 26 and the output port 28, disposed between the pair of input ports 24a, 24b, for exiting the coolant after such coolant has cooled active devices, FETs 40, 42 in the active device layer 32. The coolant pass-through layer 14 disposed, and bonded to, the input/output port layer 12 receives the coolant from the pair of input port 24a, 24b.

The coolant pass-through layer 14 (FIGS. 1A, 2A and 2B) has three sections, 46a, 46b, and 46c: sections 46a and 46c each have a plurality of, here for example, seven spaced supply slots 48S. Section 46b is disposed between sections 46a and 46c and includes a plurality of, here for example, eight return slots 48R. The slots 48S are disposed in rows disposed above the input ports 24a and 24b. The slots 48R are disposed in a row disposed above the output port 28. It is noted that the input ports 24a, 24b and the output port 28 are elongated along the X-direction (FIG. 1A), parallel to the direction of the rows of slots 48S, 48R in the three sections, 46a, 46b, and 46c which are aligned also along the X-direction. It is also noted that the slots 48S, 48R are elongated along a direction along the Y-direction which is perpendicular to the elongated direction of the input ports 24a, 24b and the output port 28. It is also noted that while the supply slots 48S in sections 46a and 46c are aligned along the X-direction, the return slots 48R are offset, along the X- and Y-directions, from the supply slots 48S. That is, while each one of the supply slots 48S in sections 46a faces (when looking along the Y-direction) a corresponding one of the supply slots 48S in section 46c, each one of the return slots 48R faces (when looking along the Y-direction) a region between a pair of the supply slots 48S.

The coolant distribution layer 16 (FIG. 1A) is integral with the coolant pass-through layer 14 and includes a plurality of parallel, channels S and R; S being a supply channels and R being a return channels. The channels S and R are elongated along the Y-direction. Here, there are seven supply channels S and eight return channels R. The supply channels S are disposed over the supply slots 48S and the return channels are disposed over the return slots 48R. It is also not that the micro-channels 26 are elongated along the X-direction; a direction perpendicular to the elongated direction of the supply and return channels S and R.

With such an arrangement, the three sections, 46a, 46b, and 46c of the coolant pass-through layer 16 provide an input transmission structure portion configured to inhibit received coolant from passing directly to the output port 28 of the input/output port layer 12 prior to such received coolant being transmitted to the plurality of cooling micro-channels 26 and enabling such heat absorbed coolant to pass directly to the output port 28 of the input/output port layer 12 without mixing with cooler fluid in the input ports 24a and 24b, as shown in FIGS. 2A through 2D.

It should be noted that the end of the input and output ports 24a, 24b of the input/output port layer 12, as well as the ends of the sots 48R and 48S of the coolant pass-through layer 14 and the slots S and R in the coolant distribution layer 16 are rounded rather than being square as shown in FIG. 1B for an exemplary one of the slots, here one of the slots 48R to reduce stress around the corners of the slots.

Figure 3:
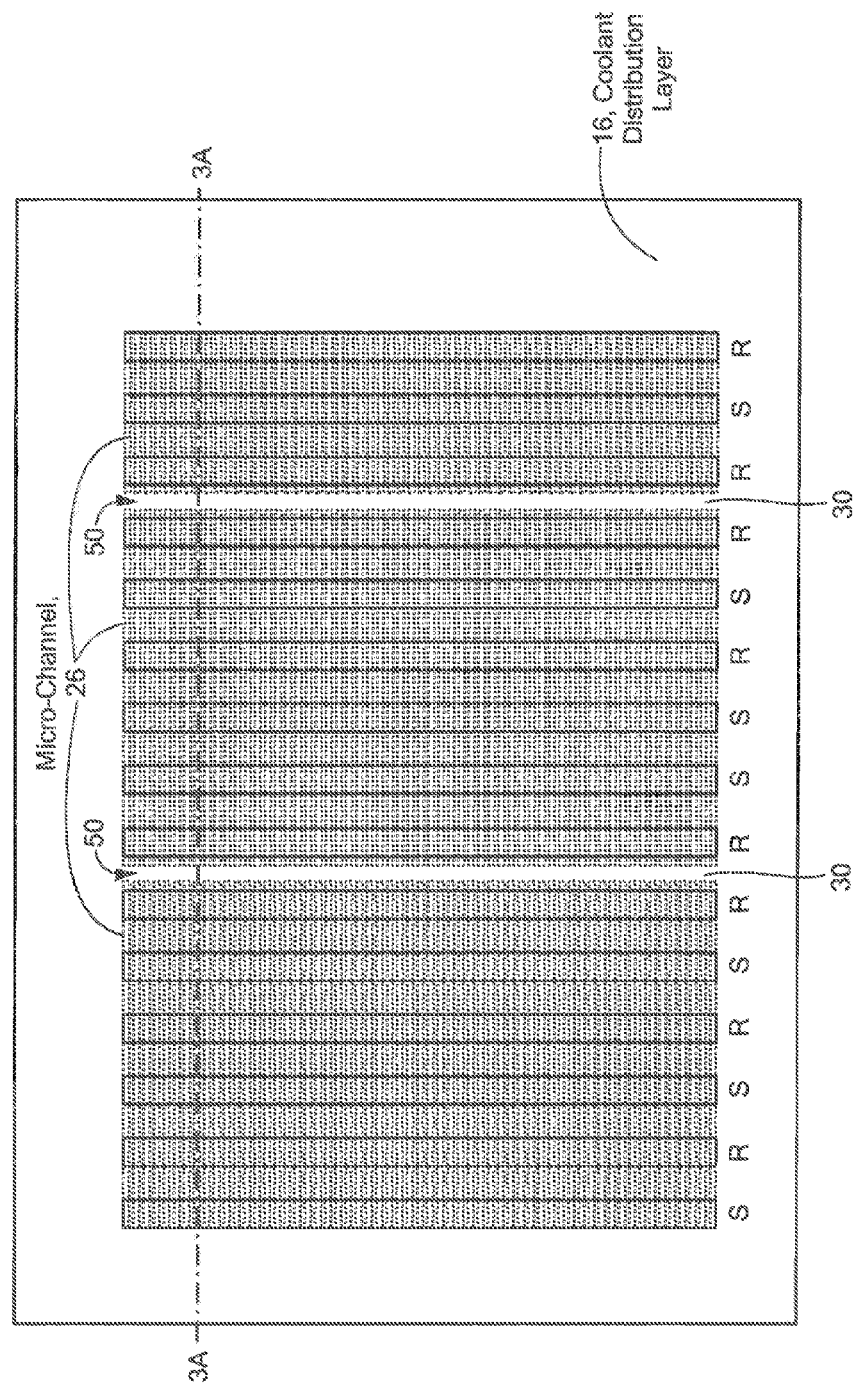
FIG. 3 is a plan view of the coolant distribution layer of the coolant distribution structure of FIG. 1 with the substrate thereon, the substrate having micro-channels in a back surface thereof.
Figure 3A:
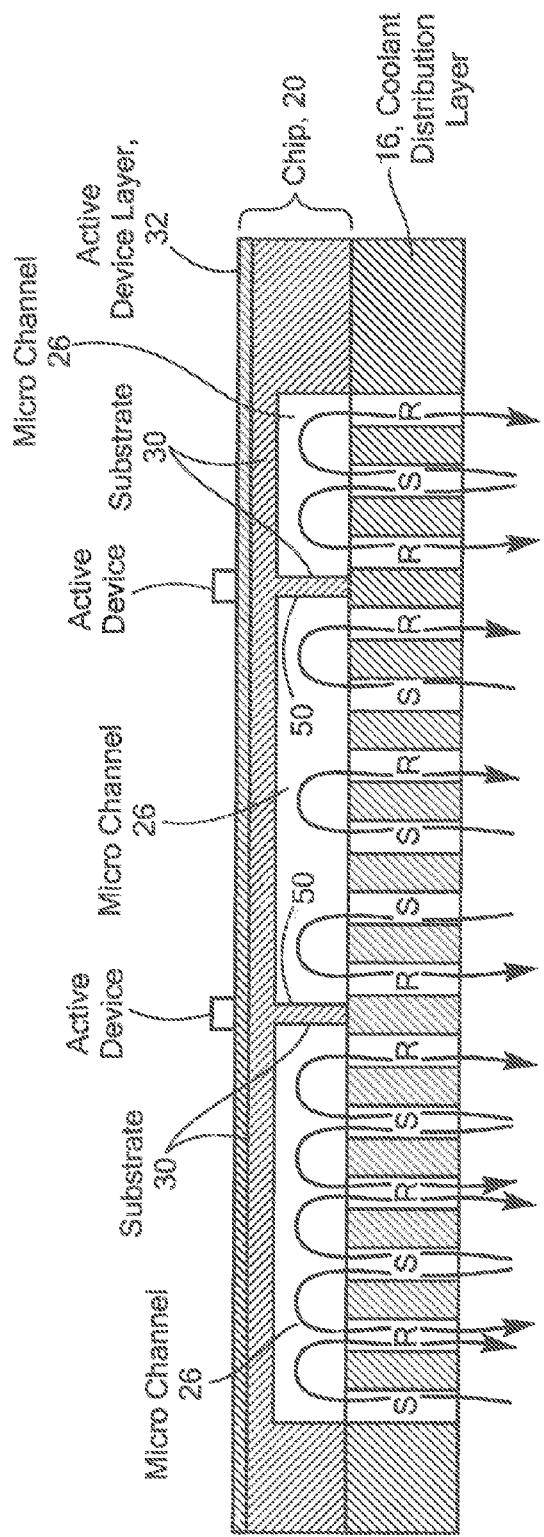
FIG. 3A is a cross sectional view taken along one of the micro-channels along line 3A-3A of FIG. 3 according to the disclosure.
Figure 4:
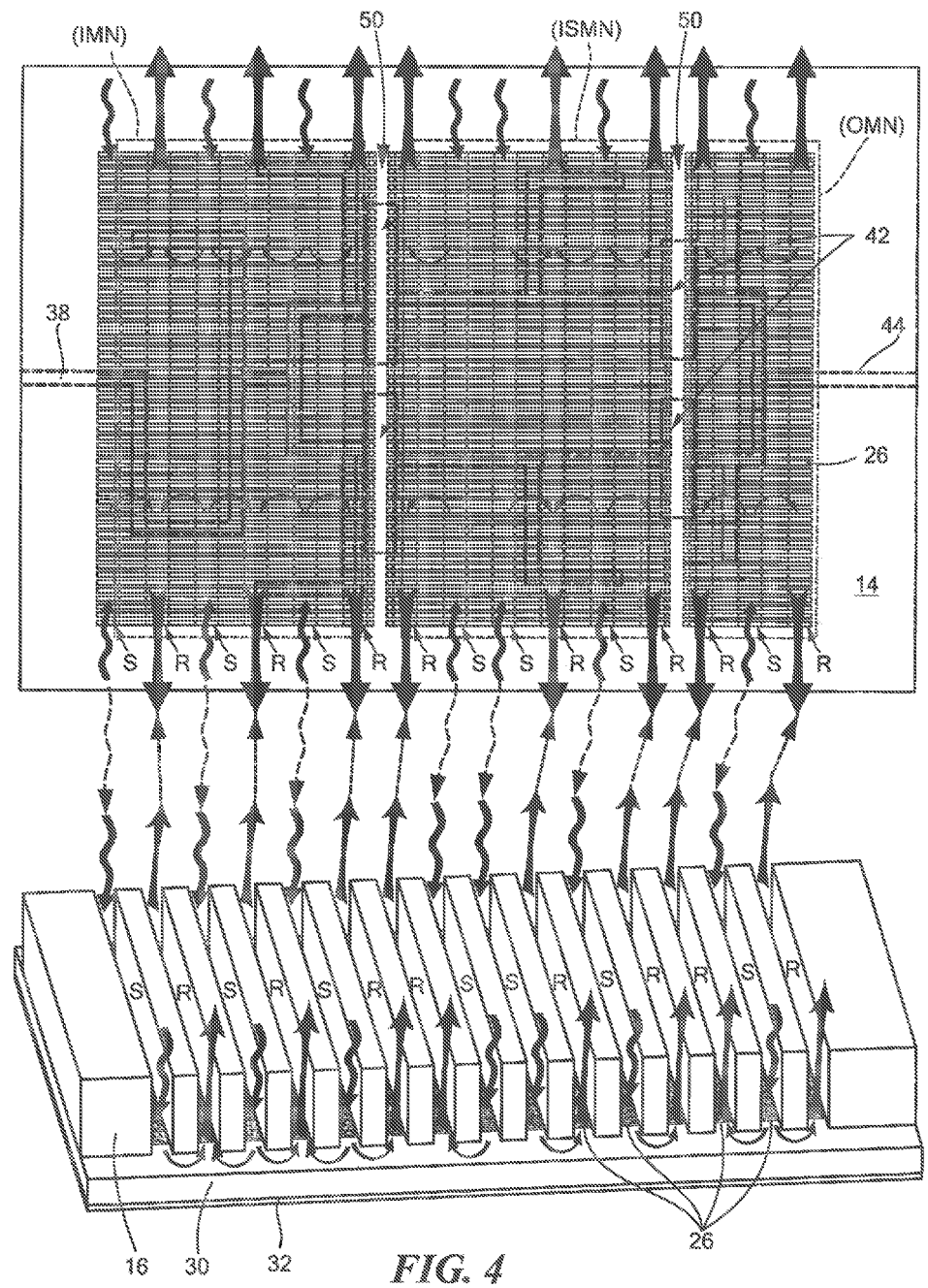
FIG. 4 is a plan view of the top surface of the substrate of the coolant distribution structure of FIG. 2, shown in relationship with an isometric view of the coolant distribution structure with the underling MMIC chip of FIG. 1 according to the disclosure; an enlarged plan view of the coolant distribution layer, substrate and active layer of the coolant distribution structure of FIG. 1 being shown in FIG. 4A and an enlarged isometric view of the coolant distribution layer, substrate and active layer of the coolant distribution structure of FIG. 1 being shown in FIG. 4B.
Figure 4A:
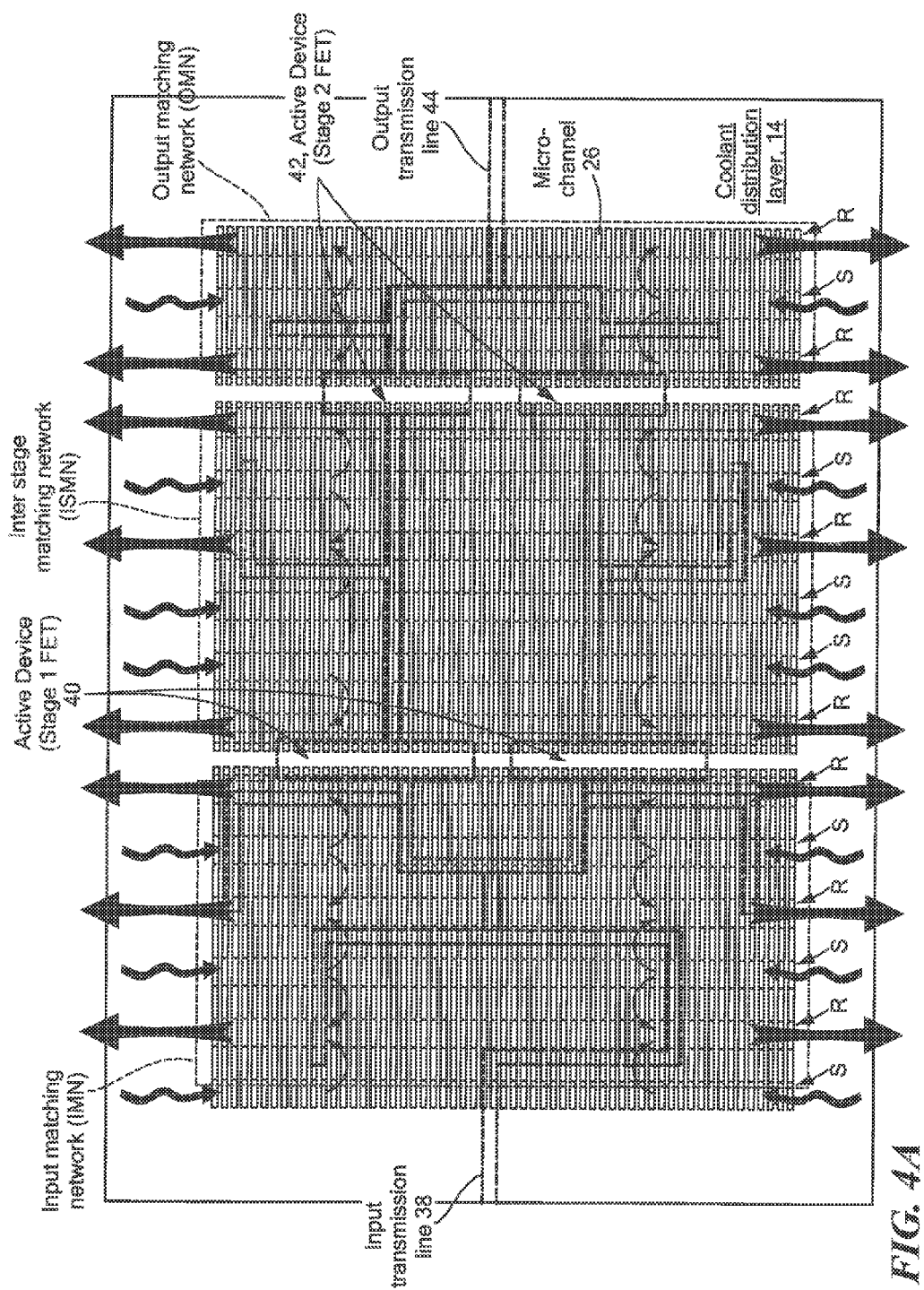
Figure 4B:
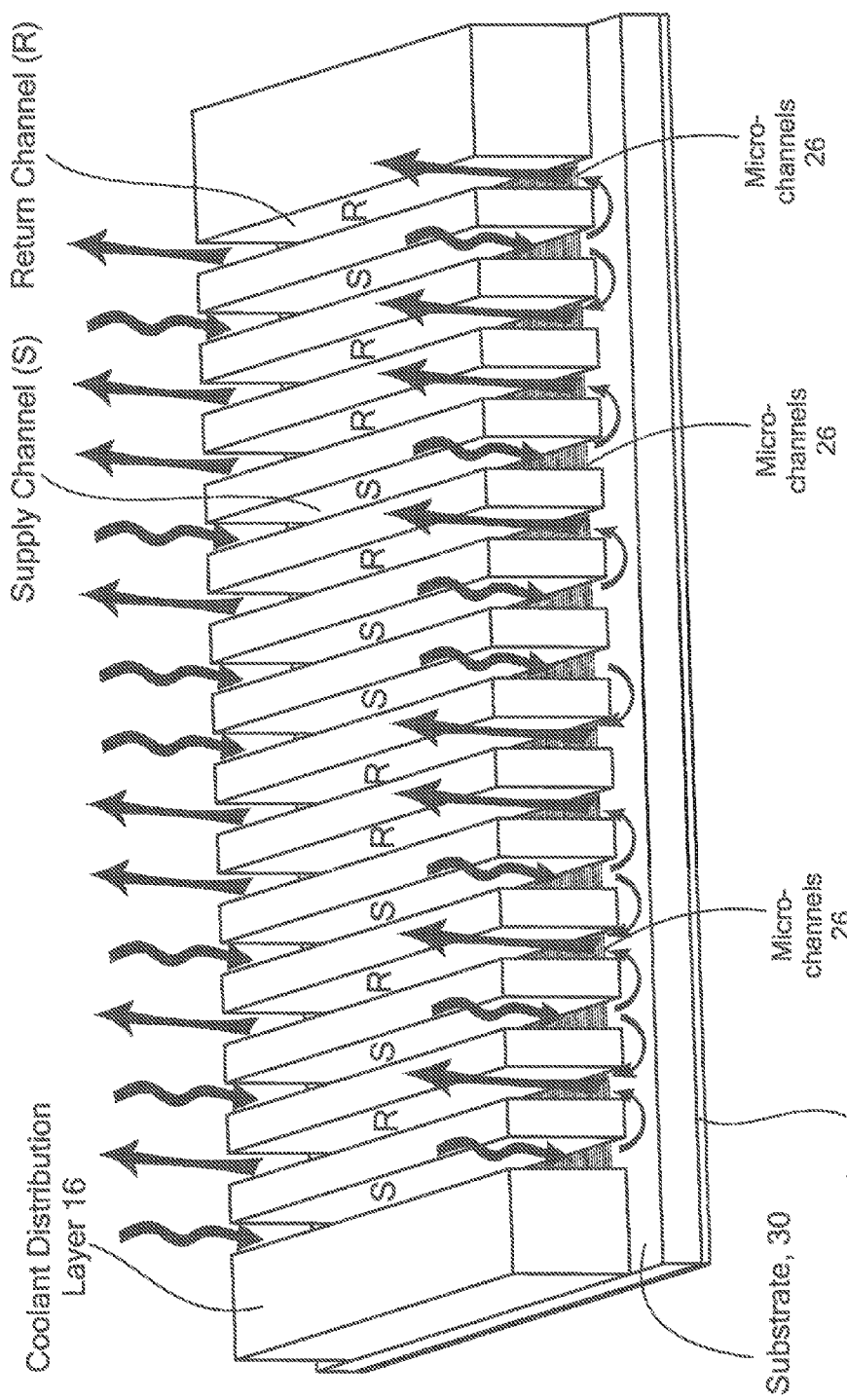

Referring now to FIGS. 3, 3A, and 4, the relationship between coolant flow, the supply Channels S and the return channels R in the coolant distribution layer 16 and, micro-channels 26, substrate 30 and the active layer 32 and the FETs 40, 42 is shown. It is noted that partitions 50 (FIG. 1A and FIG. 4) are located between all micro-channels 26 in proximity to the FETs 40, 42 being cooled to interrupt the micro-channels 26 near very high heat densities of the FETs. Thus, the coolant channels 26 are separated one from another by partitions 50 to provide the channels 26 with discontinuities along the lengths of the channels 26. This partitioning provides locally reduced fluid temperature, which, in turn provides lower FET temperature by maximizing conjugate conduction/convection heat transfer.

A number of embodiments of the disclosure have been described. Nevertheless, it will be understood that various modifications may be made without departing from the spirit and scope of the disclosure. For example, other MMIC circuits may be used with the coolant distribution structure. Further, the number of supply slots and return slots and their relative configuration may differ from one MMIC to another MMIC. Likewise, the number of micro-channels may differ from one MMIC to another MMIC. Accordingly, other embodiments are within the scope of the following claims.

What is claimed is:

1. A coolant distribution structure for an integrated circuit, the integrated circuit having a substrate with an active device layer on an top surface of the substrate and a plurality of coolant channels formed in a bottom surface of the substrate, the coolant distribution structure comprising:

plurality of stacked, parallel layers, a first one of the layers being an input/output port layer, a second one of the layers being a coolant pass-through layer; and a third one of the layers being a coolant distribution layer, the coolant pass-through layer being disposed between the input/output port layer, and the coolant distribution layer, each one of the layers having a plurality of slots therein;

wherein:

the plurality of slots in the input/output layer provide at least one input port for receiving a coolant for transmission to the plurality of coolant channels and an output port for exiting the coolant after such coolant has cooled active devices in the active device layer;

the coolant pass-through layer is disposed on the input/output port layer and wherein:

a first portion of the plurality of slots therein receive the coolant from the at least one input port and having a input transmission structure portion configured to inhibit such received coolant from passing directly to the output port of the input/output port layer prior to such received coolant being transmitted to the plurality of coolant channels through the coolant distribution layer, the coolant distribution layer inhibiting the coolant received by the first portion of the slots from passing directly to the plurality of channels, and a second portion of the slots therein pass coolant, after passing through the coolant channels, to the output port through the pass-through layer;

the coolant distribution layer is disposed between the coolant pass-through layer and mounted to the bottom surface of the substrate for distributing the coolant passing through the slots in the coolant distribution layer to the plurality of coolant channels, and wherein one portion of the slots in the coolant distribution layer receive coolant passing from the first portion of the slots in the coolant pass-through layer and distribute such received coolant to the plurality of coolant channels to absorb heat generated by the active devices, and then direct heated coolant back to the coolant pass-through layer through a second portion of the slots in the coolant distribution layer; and wherein the coolant pass-through layer has an output transmission structure portion configured to inhibit such heated coolant from passing directly to the input port of the input/output port layer prior to such heat absorbed coolant being transmitted to the output port of the input/output port layer.

2. The coolant distribution structure recited in claim 1 wherein the integrated circuit is formed on a 300 μm thick CVD grown diamond that is backside polished to <1 μm Ra.

3. The coolant distribution structure recited in claim 2 wherein the CVD grown diamond is dry-etched to form the coolant channels as a plurality of blind micro-channels with aspect ratio of approximately 10:1.

4. The coolant distribution structure recited in claim 3 wherein the dry-etched blind micro-channels terminate on the remainder of the solid diamond substrate, substrate formed thereof acting as a simultaneous heat conductor and electrical barrier between the active device layer on the top side and the coolant fluid on the bottom.

5. The coolant distribution structure recited in claim 1 wherein the integrated circuit is a monolithic integrated circuit.

6. A coolant distribution structure for an integrated circuit, the integrated circuit having a substrate with an active device layer on an top surface of the substrate and a plurality of coolant channels formed in a bottom surface of the substrate, the coolant distribution structure comprising:
- an input/output port layer having at least one input port for receiving a coolant for transmission to the plurality of coolant channels and output port for exiting the coolant after such coolant has cooled active devices in the active device layer;
- a coolant pass-through layer disposed on the input/output port layer to receive the coolant from the input port and having a input transmission structure portion configured to inhibit such received coolant from passing directly to the output port of the input/output port layer prior to such received coolant being transmitted to the plurality of coolant channels;
- a coolant distribution layer disposed between the coolant pass-through layer and mounted to the bottom surface of the substrate for receiving coolant passing from the coolant pass-through and distributing such received coolant to the plurality of coolant channels to absorb heat generated by the active devices, and then direct heated coolant back to the coolant pass-through layer;
- wherein the coolant pass-through layer has an output transmission structure portion configured to inhibit such heated coolant from passing directly to the input port of the input/output port layer prior to such heat absorbed coolant being transmitted to the output port of the input/output port layer; and
- wherein the input/output port layer has a pair of spaced input ports and wherein the output port is disposed between the pair of input ports.

7. The coolant distribution structure recited in claim 6 wherein the coolant pass-through layer has formed therein: a two sets of a plurality of parallel slots, each one of the sets being disposed over a corresponding one of the pair of input ports, the slots in the two sets being aligned one with the other to provide the input transmission structure portion; and a third set of parallel slots disposed over the output port, the slots in the third set being offset laterally from the slots in said two sets to provide the output transmission structure portion.

8. The coolant distribution structure recited in claim 7 wherein the input ports are elongated to cover the extent of the two sets of plurality of parallel slots and the output port elongated to accommodate the extent of the third set of plurality of parallel slots.

9. The coolant distribution structure recited in claim 7 wherein the slots in said two sets of parallel slots are disposed in a pair of rows and the slots in the second set of slots are disposed in a row parallel to said pair of rows.

10. The coolant distribution structure recited in claim 8 wherein the slots in said two sets and in the third set are elongated along a direction perpendicular to the rows.

11. The coolant distribution structure recited in claim 8 wherein the coolant distribution layer has formed therein a plurality of parallel slots, one set of the parallel slots being supply slots and another set of the parallel slots being return slots, the set of supply slots being in aligned with the slots in the pair of a first plurality of parallel slots and the set of return slots being in aligned with the slots in the third set of slots.

12. The coolant distribution structure recited in claim 11 wherein the set of return slots is in aligned with the slots in the second set of slots.

13. The coolant distribution structure recited in claim 11 wherein the slots in the coolant distribution layer are parallel to the slots in the coolant pass-through layer.

14. The coolant distribution structure recited in claim 12 wherein the slots in the distribution layer are parallel to the slots in the coolant pass-through layer.

15. The coolant distribution structure recited in claim 13 wherein the coolant channels in the substrate are elongated along a direction perpendicular to the slots in the distribution layer.

16. The coolant distribution structure recited in claim 13 wherein the slots in the distribution layer are perpendicular to the elongated input and output ports of the input/output port.

17. The coolant distribution structure recited in claim 13 wherein the slots in the distribution layer are perpendicular to the direction in which the input and the output ports of the input/output port layer are elongated.

18. The coolant distribution structure recited in claim 6 wherein the integrated circuit is a monolithic integrated circuit.

* * * * *